United States Patent [19]

Sanchez

[11] Patent Number: 4,888,896
[45] Date of Patent: Dec. 26, 1989

[54] UTILITY CUT PATCH IDENTIFICATION TAG

[76] Inventor: Richard E. Sanchez, 1861 Kellerton Dr., Hacienda Heights, Calif. 91745

[21] Appl. No.: 67,935

[22] Filed: Jun. 29, 1987

[51] Int. Cl.$^4$ .................................................. G09F 3/04
[52] U.S. Cl. ........................................ 40/630; 40/299; 40/909; 156/67; 156/242
[58] Field of Search ............... 40/2.2, 2 R, 199, 625, 40/630; 156/24

[56] References Cited

U.S. PATENT DOCUMENTS

| | | |
|---|---|---|
| 1,624,900 | 4/1927 | Parkhurst . |
| 1,804,389 | 5/1931 | Ellis .................................. 40/630 X |
| 2,093,583 | 9/1937 | Upton ................................. 40/630 |
| 2,098,478 | 11/1937 | Young ................................. 40/630 |
| 2,098,557 | 11/1937 | Thomas ............................... 40/630 |
| 2,129,503 | 9/1938 | Mulieri . |
| 2,232,023 | 2/1941 | Flocks . |
| 3,512,460 | 5/1970 | Surine et al. ..................... 40/630 X |
| 3,587,415 | 6/1971 | Eigenmann et al. . |
| 3,908,055 | 9/1975 | Susuki et al. . |

FOREIGN PATENT DOCUMENTS 6324  2/1932  Australia .............................. 40/909

OTHER PUBLICATIONS

3M—Specification for Durable Preformed Patterned Pavement Markings with Improved Retroreflectivity Retention.

Primary Examiner—Gene Mancene
Assistant Examiner—Wenceslao J. Contreras
Attorney, Agent, or Firm—Christie, Parker & Hale

[57] ABSTRACT

A non-penetrating utility cut patch identification tag comprises a wafer of a durable, pliant polymeric material coated on its lower surface with adhesive and having labeling indicia on its upper surface. The tag is preferably circular with a diameter of from about one to about two inches. The tag is pressed into the surface of fresh paving material which has been introduced into a previously cut out section of pavement.

10 Claims, 1 Drawing Sheet

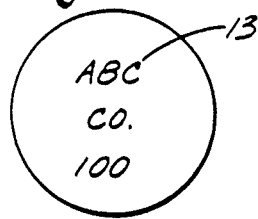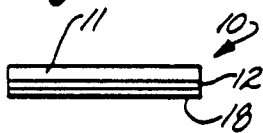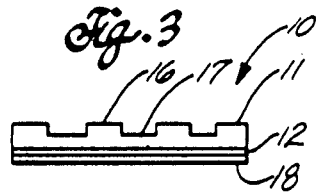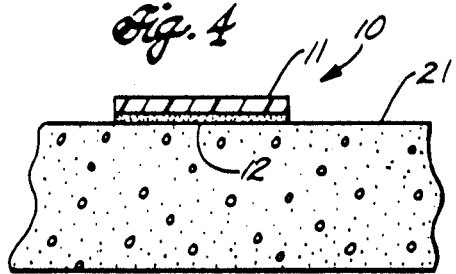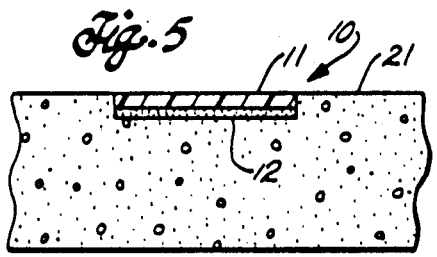

UTILITY CUT PATCH IDENTIFICATION TAG

FIELD OF THE INVENTION

This invention relates to utility cut patches and more particularly to an identification tag for utility cut patches.

BACKGROUND OF THE INVENTION

To perform repairs on utility equipment located beneath streets or other paved surfaces or to install new equipment beneath streets or other paved surfaces, utility companies typically cut and remove a section of the overlying pavement material, i.e., asphalt or concrete, thus leaving a hole in the pavement. After the installation or repair has been completed, the paved surface is repaired by filling the hole with new paving material. The repaired sections are generally referred to as utility cut patches.

Government regulations generally require paving companies to label utility cut patches that they have installed. Current markers consist of a metal washer which is secured to the surface of the utility cut patch by means of a nail which extends through the washer and into the paving material. These nails and washers have been mistaken for survey tags. This has led to improper laying of building foundations.

Furthermore, it is not uncommon for the nail to work its way loose within a short time. This occurs due to contraction and expansion of the paving material. This may also occur due to repeated striking of the washer and nail by cars and pedestrians which occurs because the washer and nail typically protrude above the surface of the cut patch.

Once it has worked loose, the nail and washer may be dislodged from the utility cut patch. This eliminates a primary record of the company that has installed the cut patch. This also results in a loose nail on the surface of a roadway, which could puncture an automobile tire or otherwise injure members of the public.

In addition, the nails often extend through the paving material. When the nails loosen, and particularly when they are dislodged, moisture easily penetrates the cut patch through the nail hole. Such water seepage may cause rust or have some other detrimental effect on the underlying equipment.

SUMMARY OF THE INVENTION

Accordingly, the present invention provides a non-penetrating utility cut patch identifying tag comprising a small generally flat wafer made of a pliant, durable polymeric material. On the top surface of the tag, there is provided indicia indicating for example the identity of the paving company that has installed the cut patch on which the tag is applied. A layer of adhesive material is coated onto the bottom surface of the wafer.

The tag is preferably circular and preferably has a diameter of from about 1 to about 2 inches. The thickness is preferably less than about ¼ inch and more preferably less than about ⅛ inch.

The present invention further comprises a method for repairing and identifying a cut out section of a paved surface. The method comprises filling the cut out section with a paving material so that the upper surface of th paving material is generally coplanar with the surrounding paving material. The process further comprises applying an identifying tag as described above to the paving material before the material dries or cures. The tag is pressed into the paving material so that the tag is at least partially embedded within the surface of the paving material.

BRIEF DESCRIPTION

These and other features and advantages of the present invention will be better understood by reference to the following detailed description when considered in conjunction with the accompanying drawings wherein:

FIG. 1 is a top view of preferred utility cut patch identification tag;

FIG. 2 is a side view of the identification tag of FIG. 1;

FIG. 3 is a side view of an alternate embodiment of a utility cut patch identification tag;

FIG. 4 is a side cross-sectional view of an identification tag lying on freshly laid paving material; and FIG. 5 is a side cross-sectional view of an identification tag embedded into freshly laid paving material.

DETAILED DESCRIPTION

A preferred utility cut patch identification tag is shown in FIGS. 1 and 2. The identification tag 10 comprises a flexible wafer 11 having upper and lower surfaces. The lower surface of the wafer 11 is coated with a layer of adhesive material 12. On the upper surface of the wafer 11, there is provided indicia 13 indicating, for example, the name of the company that installed the cut patch to which the tag is applied, the type of equipment underlying the cut patch to which the tag is applied, or the like.

The wafer 11 may be made of any suitable, durable, pliant polymeric material that may comprise a variety of fillers as desired. Preferred fillers include pigments which impart color to the wafer, and glass beads or the like which impart reflectivity to the wafer. Color and reflectivity are desired to make the tags easily located during the day and night.

Adhesive layer 12 coated onto the bottom of the wafer 11 may comprise any suitable adhesive material which forms a bond between the wafer 11 and the paving material to which the tag 10 is applied. Adhesive layer 12 may be applied to the wafer 11 just before installation of the tag 10. More typically, however, the adhesive layer 12 comprises pressure sensitive adhesive which is applied long before installation of the tag 10 and protected by a removable backing film 18, which may be peeled off just before installation.

The indicia 13 may be in any suitable form. For example, the indicia 13 may comprise markings coated onto the wafer 11 with a suitable material such as ink or paint. Alternatively, the indicia 13 may comprise markings engraved into the wafer 11 or comprise raised markings such as raised letters or the like. The indicia may even be provided by using a wafer with a distinctive outline or shape.

The presently preferred material for the wafer and adhesive material is sold by the 3M Company as a preformed patterned pavement marker under the designations L350 White Linered, L351 Yellow Linered, A350 White Non-Linered and A351 Yellow Non-Linered. Such materials are currently used as lane markers crosswalk markers and word/symbol markers on roadways.

The upper surface of the wafer may be smooth as shown in FIGS. 1 and 2 or irregular, for example as shown in FIG. 3 wherein the wafer comprises alternating plateaus 16 and valleys 17.

If the wafer comprises a reflectivity imparting filler, it is preferred that the upper surface of the wafer have raised sections or is otherwise irregular. Such surfaces tend to enhance reflectivity of the tag.

In the embodiment shown, the identification tag 10 is generally circular in shape and has a diameter of about 1.25 inches. A circular shape is presently preferred because it tends to be more easily installed and resists removal better than tags having sharper corners. It is understood, however, that other shapes such as squares, triangles, diamonds, or the like may be used if desired. Other shapes may be desirable for providing indicia 13.

The size of the tag 10 is also not critical. It is presently preferred that the area of the tag be less than about 5 square inches and preferably from about 1 to about 3 square inches. For example, circular tags having a diameter of from about 1 to about 2 inches are presently preferred.

Like the diameter of the tag 10, the thickness of the tag is not critical. The minimum thickness is generally that which imparts sufficient physical integrity and durability to the tag 10 to withstand environmental forces to which the tag is subjected during use for a reasonable time, e.g., at least one year, without destruction. It is preferred that the thickness not exceed that which enables the tag 10 to be easily pressed into the paving surface so that the top of the tag is flush with the surface of the paving material. If the paving material is asphalt or concrete, a thickness of no more than about ⅛ inch is preferred. If the paving material is mortar, cement or the like, a greater thickness, e.g., ¼ inch, may be used The presently preferred thickness is from about 1/32 to about 1/16 inch.

In the process of the present invention, an identification tag as described above is installed in the surface of freshly laid paving material. More particularly, in repairing a cut out section of pavement such as asphalt, fresh paving material, i.e., asphalt, is introduced into the cut out section. A roller is passed over the freshly applied material so that the surface of the fresh paving material is generally flush or coplanar with the surface of the surrounding paving material. Before the freshly applied paving material hardens, as shown in FIG. 4, the identification tag 10 having an adhesive layer on its lower surface is applied to the surface of the freshly laid paving material 21. The identification tag 10 is then pressed downwardly into the freshly applied paving material 21 so that the tag 10 is at least partially embedded within the surface of the paving material 21, as shown in FIG. 5. Preferably, the upper surface of the tag 10 is flush with the top surface of the paving material so that the environmental forces to which the tag will be subjected, such as those exerted by vehicular traffic, are minimized. This is preferably accomplished by applying the tag 10 to the surface of the paving material 21 prior to final rolling. Final rolling then presses the tag 10 into the paving material 21.

This invention provides a relatively permanent marker which can expand and contract with expansion and contraction of the paving material caused by changes in temperature. The tag also provides a non-penetrating marker for a utility cut patch so that water seepage is not a problem.

From the foregoing description, it is apparent that many variations and modifications of the above-described structures and procedures may be practiced without meaningfully departing from the scope of the invention. Accordingly, the foregoing description should not be read as pertaining only to the precise structures and procedures described, but rather should be read consistent with and as support for the following claims for the fullest and fairest scope.

What is claimed is:

1. A method for repairing and identifying a cut out section of pavement comprising:
    filling the cut out section of the pavement with a fresh paving material;
    smoothing the fresh paving material so that the surface of the fresh paving material is generally flush with the surface of the surrounding pavement;
    applying an identifying tag to the surface of the paving material, said identification tag having a top surface area of no more than about five square inches and comprising a generally flat wafer made of a pliant, durable polymeric material with upper and lower surfaces, a layer of adhesive material coating the lower surface of the wafer, and at least one labeling indicia on the upper surface of the wafer; and
    pressing the identification tag into the paving material so that the wafer is at least partially embedded within the top surface of the paving material.

2. A method as claimed in claim 1 wherein the identification tag is generally circular.

3. A method as claimed in claim 2 wherein the diameter of the tag is from about 1 to about 2 inches.

4. A method as claimed in claim 1 wherein the paving material is asphalt and the thickness of the identification tag is no more than about ⅛ inch.

5. A method as claimed in claim 1 wherein the polymeric material comprises at least one colored pigment.

6. A method as claimed in claim 1 wherein the polymeric material comprises at least one filler for imparting reflectivity to at least the upper surface of the wafer.

7. A method as claimed in claim 6 wherein the surface of the wafer comprises at least one raised section.

8. A method for repairing and identifying a cut out section of pavement comprising:
    filling the cut out section of the pavement with a fresh paving material;
    smoothing the fresh paving material so that the surface of the fresh paving material is generally flush with the surface of the surrounding pavement;
    applying an identifying tag to the surface of the paving material, said identification tag having a top surface area of no more that about five square inches and comprising a generally flat wafer made of a pliant, durable polymeric material with upper and lower surfaces, and indicia means for visually conveying a predetermined message; and
    pressing the identification tag into the paving material so that the wafer is at least partially embedded within the top surface of the paving material.

9. A method as claimed in claim 8 wherein the indicia means comprises a predetermined shape of the wafer.

10. A method as claimed in claim 8 wherein the indicia means comprises labeling indicia on the upper surface of the wafer.